(12) United States Patent
Steffens

(10) Patent No.: US 6,693,937 B2
(45) Date of Patent: Feb. 17, 2004

(54) INTEGRATED TUNABLE LASER

(75) Inventor: Wolf Steffens, Bundesrepublik Deutschland (DE)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/120,045

(22) Filed: Apr. 10, 2002

(65) Prior Publication Data

US 2003/0035455 A1 Feb. 20, 2003

(30) Foreign Application Priority Data

May 15, 2001 (EP) .......................................... 01111723

(51) Int. Cl.[7] ................................................ H01S 5/00
(52) U.S. Cl. ...................................................... 372/50
(58) Field of Search ............................... 372/50, 96, 20

(56) References Cited

U.S. PATENT DOCUMENTS 5,511,084 A * 4/1996 Amann ........................ 372/20

OTHER PUBLICATIONS

Jobst, B., Examiner. European Search Report, Application No. EP 01 11 1723, dated Oct. 15, 2001.
Rigole P–J et al. "114–nm Wavelength Tuning Range of a Vertical Grating Assisted Codirectional Coupler Laser with a Super Structure Grating Distributed Bragg Reflector," IEEE Photonics Technology Letters, vol. 7, No. 7, Jul. 1, 1995, pp. 697–699, New York, US.

Alferness R C et al. "Broadly Tunable InGaAsP/InP laser based on a vertical coupler filter with 57–nm tuning range," Applied Physics Letters, American Institute of Physics, vol. 60, No. 26, Jun. 29, 1992, pp. 3209–3211, New York, US.

Delorme F et al. "Simple Multiwavelength Device Fabrication Technique Using a Single–Grating Holographic Exposure," IEEE Photonics Technology Letters, vol. 8, No. 7, Jul. 1, 1996, pp. 867–869, New York, US.

* cited by examiner

*Primary Examiner*—Quyen Leung

(57) ABSTRACT

An integrated tunable laser structure comprising a substrate made of semiconductor material, the substrate comprising a first, a second, and a third section. The first section provides a low-selective interferometric filtering together with an amplification of a light wave resonating in the laser structure. The second section provides continuous fine-tuning and phase adjustment of the light wave, and the third section provides a wavelength selective reflection of the light wave. Each section allows current injection, wherein a current into the first section causes a wavelength shift of the low-selective interferometric filtering, a current into the second section causes a wavelength shift of resonator modes, and a current into the third section causes a wavelength shift of the wavelength selective reflection.

17 Claims, 5 Drawing Sheets

Fig. 4
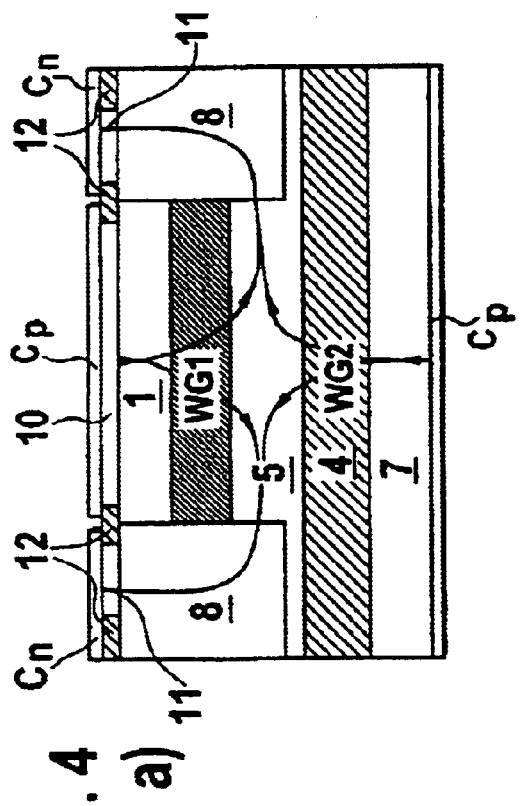
a)
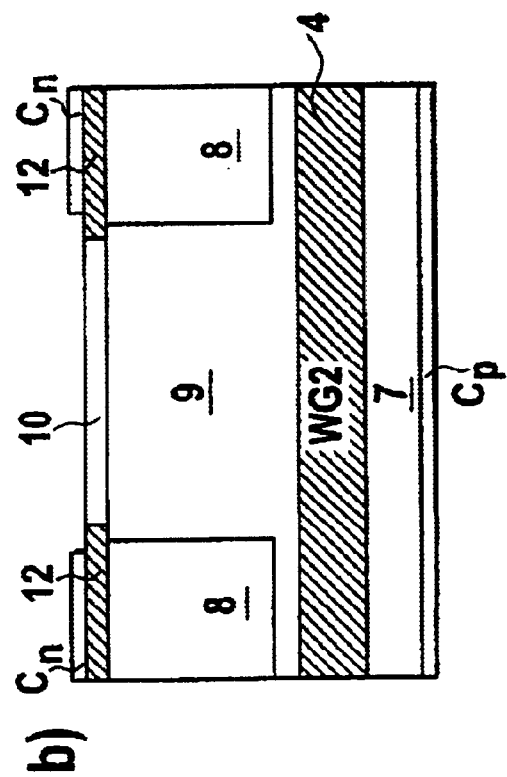
b)
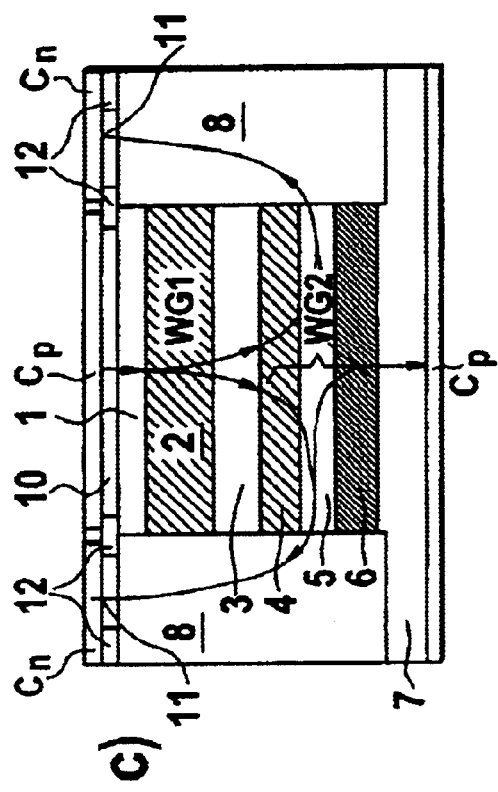
c)
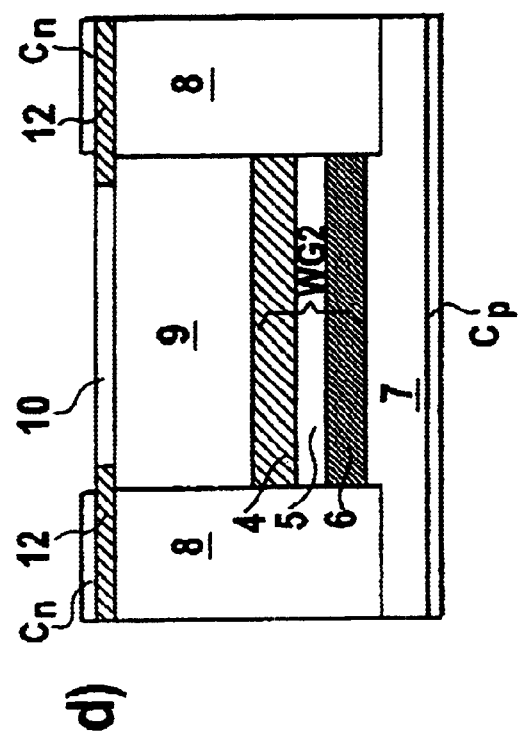
d)

INTEGRATED TUNABLE LASER

BACKGROUND OF THE INVENTION

1. Field of the Invention

The present invention relates to an integrated tunable laser structure.

Widely tunable semiconductor lasers are key devices for high capacity wavelength division multiplexed (WDM) transmission and photonic switching systems and offer several advantages to increase the capacity, functionality and flexibility of WDM networks. The invention deals with semiconductor lasers and, more particularly, to configurations thereof that provides wavelength tunability. The basic physical mechanism underlying the electronic wavelength tuning is the refractive index control by exploiting carrier injection (plasma effect), well known in the art.

2. Discussion of the Background Art

A large range tunable laser diode is achieved by monolithic integration of a gain section and also an optical filter with electronically adjustable transmission within a laser resonator so that the optical filter is providing a mode filtering mechanism but also the tuning mechanism. The filtering function can be achieved by an optical filter, which can be based on different filter mechanism, namely interferometric filtering, co-directional coupling and contra-directional coupling.

The principal approach using co-directional coupling for wide wavelength tuning is the usage of laser cavities in which the lasing mode consists of a superposition of co-directionally (i.e. forward) coupled waveguide modes. This co-directional filter (e.g. vertical coupler filter (VCF)) selects only one resonator mode, and the tunability is realized by the wavelength shift of this filter function in order to select another cavity mode. One control current is necessary for the wavelength tuning of laser structures employing only co-directional coupling such as the Vertical Coupler Filter (VCF) laser and the Vertical Mach-Zehnder (VMZ) laser. In this wavelength-tuning scheme the emitted wavelength jumps from one cavity mode to the neighboring one as determined by the maximum of the effective cavity gain.

A laser structure containing a Mach-Zehnder interferometer was described in U.S. Pat. No. 5,511,084 and in European Patent specification EP 0664 587 B1 (inventor M.-C. Amann).

A laser, where the mode selection is performed by utilizing a vertical coupler filter (VCF) was presented by Alferness et al. in "Broadly Tunable InGaAsP/InP Laser Based on a Vertical Coupler Filter with 57-nm Tuning Range", Appl. Phys. Lett., 1992,60, pp. 3209–3211.

However, the filter bandwidth and the wavelength tuning range are proportional to each other, so that the requirement of keeping the filter bandwidth narrow enough for single-mode operation also limits the total tuning range. This limitation is eased in the case of the Vertical Grating Assisted Co-directional Coupler Laser with Rear Sampled Grating Reflector (GCSR) laser where a Sampled Grating Distributed Bragg Reflector (SG-DBR) filter or a Superstructure Sampled Grating Bragg Reflector (SSG-DBR) filter is combined with a VCF (M.Öbeig et al. in "74-nm Wavelength Tuning Range of an InGaASP/InP Vertical Grating Assisted Co directional Coupler Laser with Rear Sampled Grating Reflector", IEEE Photonics Technology Letter, Vol. 5, No, 7, July 1993. and to Pierre-Jean Rigole et al. in "114-nm Wavelength Tuning Range of a Vertical Grating Assisted Co directional Couple Laser with Super Structure Grating Distributed Bragg Reflector", IEEE Photonic Technology Letter, 7, 7, July 1995.

The double filtering effect allows single mode operation with high side-mode suppression ratio (SSR) for a wide wavelength tuning range. By integrating an additional phase section, the laser allows tuning in a quasi-continuous tuning mode, where each wavelength within the tuning range can be selected.

From the above major disadvantages of prior art solutions became evident: Different applications need special requirements with respect to wavelength control, side mode suppression ratio and optical output power. An efficient stationary side-mode suppression ratio well above 30 dB and optical output power above 13 dBm are demanded for high performance optical communications. Devices without contra-directional coupling such as the VCF or VMZ laser are hardly suited for applications where a high spectral purity is needed. Additionally, due to the discontinuous tuning schemes of these devices, the emitted wavelength jumps during tuning from one wavelength mode to another one. Therefore, only a specific wavelength that does not necessarily correspond to a desired wavelength grid can be selected. The GCSR laser allows single mode operation for a wide wavelength bandwidth. Due to the fine-tuning section the optical phase can be adjusted enabling the possibility of quasi-continuous tuning. However, in the GCSR laser only about 25% of the laser cavity is covered by the active section. This leads to an insufficient optical output power. Additionally, the longitudinal sectioning into four zones represents a disadvantage of the GCSR laser; this makes manufacturing of these components more difficult and increases the total laser length. This in turn reduces the mode selectivity and also limits the direct modulation bandwidth. Also, internal reflections at the grating of the VCF may influence the laser operation. As a consequence, a more sophisticated resonator structure is required for the single longitudinal mode operation with a strong suppression of side modes and high optical output power.

SUMMARY OF THE INVENTION

It is an object of the invention to provide an improved laser structure. The object is solved by the independent claims. Preferred embodiments are shown by the dependent claims.

The laser structure of the invention provides at the same time a large quasi-continuous tuning range and a high spectral selectivity. The tunable laser diode can be made with high optical output power and high side mode suppression ratio. The invention comprises the advantage of a laser structure like the GCSR laser while simultaneously supplying the high optical output power like the VMZ laser. Beside the improved performance the presented laser has a much easier fabrication technology compared to the GCSR laser where a coupler section including a grating and additional the active section has to be longitudinally integrated.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference sign(s). The drawings show in:

FIGS. 4a,b cross sectional views of the laser of FIG. 2 for illustrating a design where the active and the tuning layer correspond to WG1 and WG2, respectively;

FIGS. 4c,d cross sectional views of a device, where the active and the tuning layer are both combined in WG2;

DETAILED DESCRIPTION OF THE INVENTION

Laser devices without contra-directional coupling as used in DFB and DBR lasers are hardly suited for applications where a high spectral purity is needed, such as high performance optical communication. With this respect an efficient stationary side-mode suppression ratio well above 30 dB should be demanded. The principle tuning mechanism of a widely tunable laser diode, having a filtering function that can be shifted in wavelength is to select a certain resonator mode. However, the maximum shift of a DBR like structure is limited to a value below 1% of the wavelength. To achieve a higher tuning range utilizing sharp contra-directional filtering, a grating reflector exhibiting a comb mode reflection spectrum has to be employed together with an additional far selecting filter element with wider tuning range as done in the 4-section GCSR laser.

Figure 1:
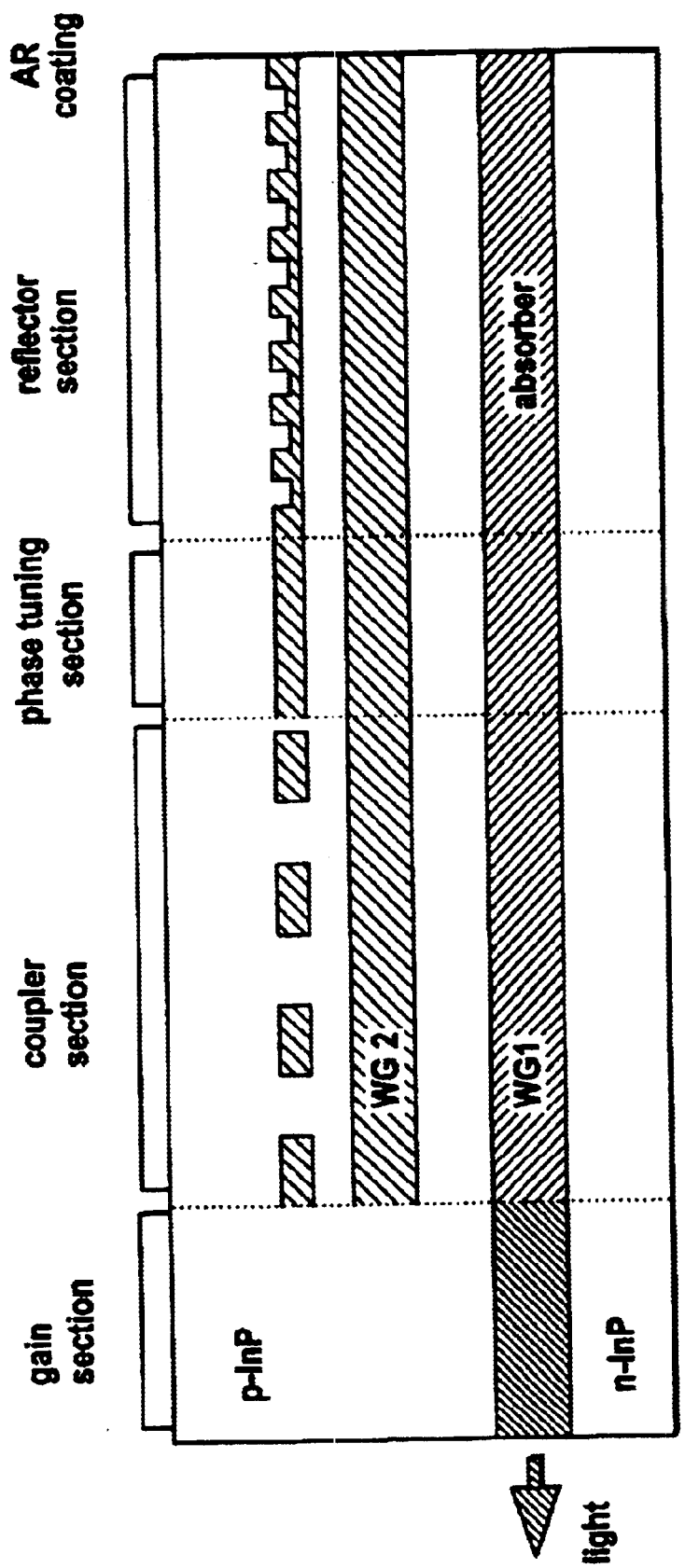
FIG. 1 a sectional view of a known vertical grating assisted co-directional coupler laser with rear sampled grating reflector (GCSR laser)

FIG. 1 illustrates a sectional view of the known vertical grating assisted co-directional coupler laser with rear sampled grating reflector (GCSR) laser. There, the coupler section (of the VCF-type) acts as a coarse wavelength-tuning element. A current through this VCF section causes a shift of the coupler-filter function over an area greater than 100 nm. This section selects one of the wavelengths reflected back from the rear Bragg grating section. The very end of the laser structure may be deposited by an anti-reflective coating AR.

However, in the GCSR laser only about 25% of the laser cavity is covered by the active section. This leads to an unsatisfactory optical output power. Also, the longitudinal sectioning into four zones makes manufacturing of these components critical.

Figure 2:
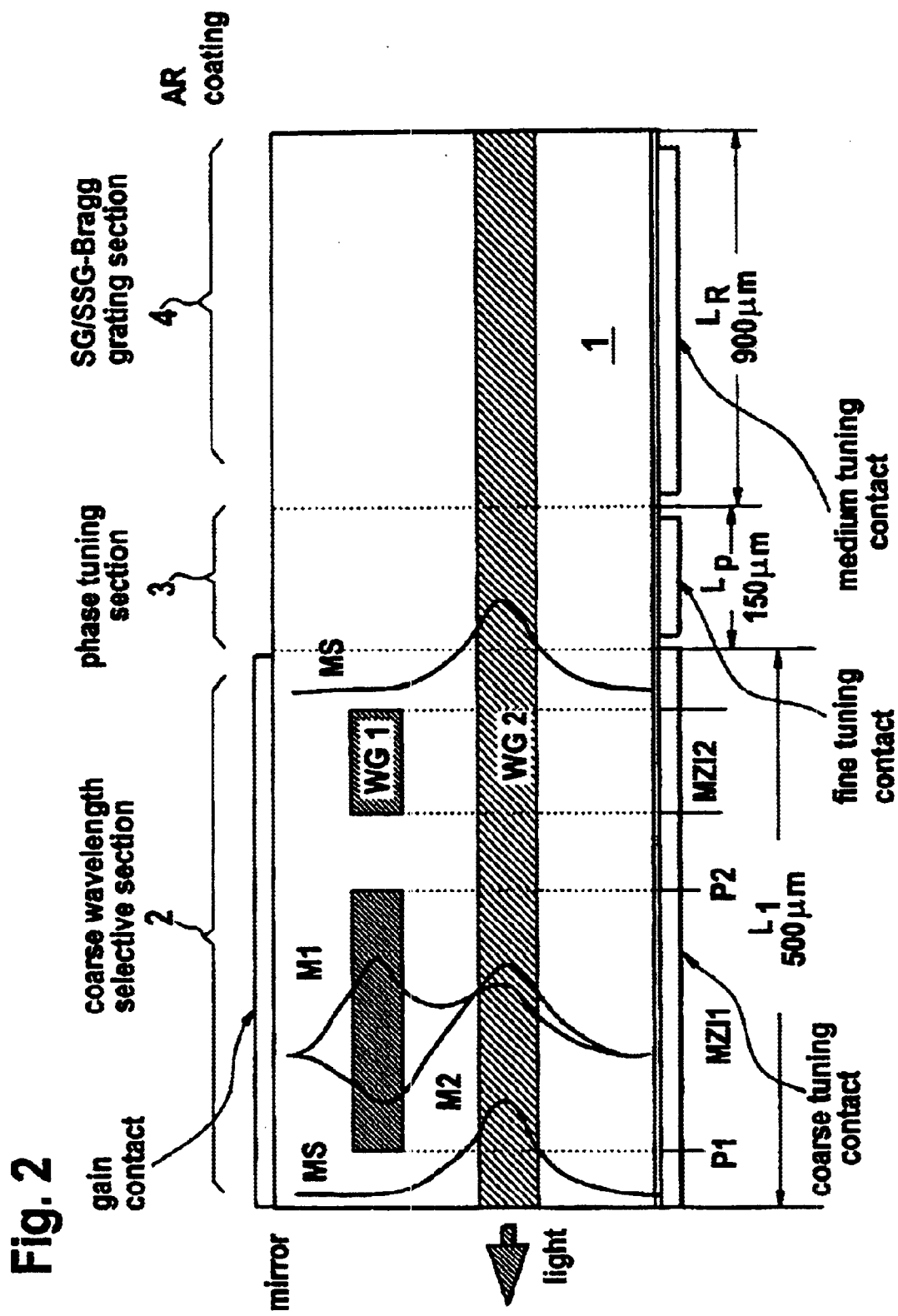
FIG. 2 a sectional view of an assisted grating interferometric (AGI) laser according to the invention.

The presented novel tunable laser diode shown in FIG. 2 comprises three sections, a coarse wavelength selective section, which also contains the active region, a phase tuning section and a Bragg grating section, the end of which may be deposited by an anti-reflective coating. Reasonable values are e.g.: the total length $L_I$ of the MZI1 and MZI2 regions plus the two single mode wave guides is approximately 500 $\mu$m, the length $L_P$ of the fine tuning section is approximately 150 $\mu$m and the length $L_R$ of the reflector (SG/SSG-Bragg grating) section is approximately 900 $\mu$m, as can be seen in FIG. 2 below the three tuning contacts: coarse tuning contact, fine tuning contact and medium tuning contact.

The coarse wavelength selective section contains two Mach-Zehnder interferometer regions MZI1 and MZI2 with two different lengths. The other regions within the coarse wavelength section comprise only one single mode waveguide supporting the transverse mode MS. The two Mach-Zehnder interferometer regions MZI1 and MZI2 comprise a double wave guide structure WG1 and WG2 which supports the two modes M1 and M2, where M1 is the even and M2 the odd mode of the double wave guide as indicated in FIG. 2. The mode MS of a single mode region is coupled with the two modes M1 and M2 at the interfaces P1 and P2 to the MZI1 and MZI2 regions. At these coupling interfaces, a superposition of the modes M1 and M2 is excited by the mode MS of the single mode region. The wave guides are designed in such way, that the superimposition of mode M1 and M2 reshape the transverse field distribution of the single mode region where the two modes M1 and M2 are added in wave guide WG2 and canceled in wave guide WG1, leading to a maximum coupling efficiency. The two modes M1 and M2 propagate along the double wave guide structure with different phase velocities. After traversing a MZI region, constructive interference of mode M1 and M2 into mode MS is only possible for certain wavelengths:

$$\lambda_0 = \frac{L\Delta n}{N}, N = 1, 2, 3...$$

where $\Delta n$ is the difference of the two effective refractive indices of the two modes M1 and M2. Thus, the transmission of the light through a MZI is wavelength dependent and so it leads to a wavelength filtering. Best selectivity of the filter function is obtained when the amplitudes of both modes M1 and M2 are identical (amplitude-match condition). However, the Mach-Zehnder interferometer region MZI is an ambiguous filtering element, where the distance between two maxima of the filter curve depends on the interferometer length. A short MZI length leads to a wide filter curve, whereas a long MZI length leads to a sharp filter curve with a short periodicity, as illustrated in FIG. 3a.

However, by combining both, a long and a short MZI region where both length are integral multiples of $$\frac{\lambda_0}{\Delta n}$$

results in a filter curve which consists of short period oscillations modulated by a long period curve in such way that the maximum of both filter curves coincide. This is true at $\lambda_0$.

Figure 3:
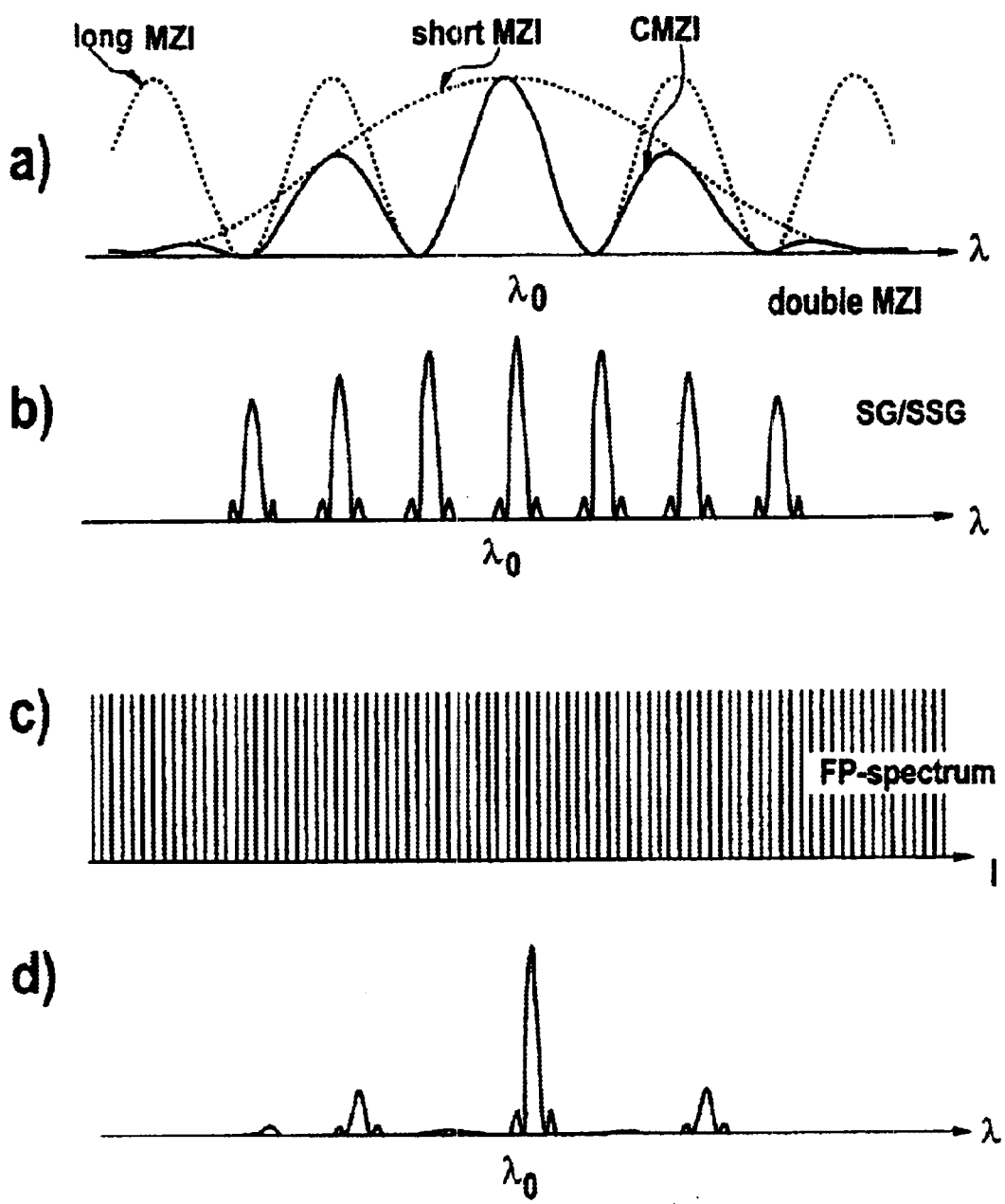
FIG. 3a an illustration of the filtering mechanism of a VMZ structure with a combined short and long interferometer of the laser shown in FIG. 2, a tuning current flowing through this coarse wavelength tuning CMZI causes a shift of the filter function over an area greater than 100 nm.
FIG. 3b an illustration of the selection of the wavelengths reflected back from the rear Bragg grating section.
FIG. 3c illustrates the dependence of the above selection on the comb mode position.
FIG. 3d a representation of the lasing spectrum.

The above-described behavior is demonstrated in FIG. 3a. The transmission of the light through the combined Mach-Zehnder interferometer CMZI gives an unambiguous wavelength filtering as the solid line curve shows. A current injected into the tuning layer of the coarse wavelength selective section via the coarse tuning contact results in a shift of the filter function. Due to the plasma effect, the refractive index of this layer is lowered and the effective refractive index difference $\Delta n$ of the two modes R and S is varied. This leads to a shift of the filter curve with its center wavelength $\lambda_0$. According to the simultaneous biasing of both interferometers via the coarse tuning contact with equal current density both filter curves (the one of the long MZI and the short MZI) move synchronously during tuning operations. A combined Mach-Zehnder interferometer filter element was previously employed in the vertical Mach-Zehnder (VMZ) laser. There, the VMZ is used as the only wavelength selective element within a laser resonator. Unfortunately, it is difficult to make these filters sufficiently narrow, to guarantee single-wavelength operation with sufficient side mode suppression required for telecommunication systems applications. Therefore, a more sophisticated resonator structure is required.

As in a distributed Bragg reflector (DBR) laser, sharp contra-directional filtering is realized by a diffraction grating etched in the passive section of the device. The reflection spectrum of a distributed Bragg reflection (DBR) grating essentially exhibits a strong dominant reflection peak exactly at the Bragg wavelength. A grating reflector exhibiting a comb mode reflection spectrum can be realized by spatial modulation of the Bragg grating. This modulation may apply either to the amplitude AM or the local spatial frequency FM of the grating. The spatial Fourier transform decomposes the sampled grating into a superimposition of homogeneous Bragg gratings with different Bragg grating amplitudes. The corresponding devices are denoted as sampled grating (SG) DBR (AM) and super-structure grating (SSG) DBR (FM).

The reflection spectrum of the SG/SSG-DBR is illustrated in FIG. 3b. Medium tuning is accomplished by varying the current via the medium tuning contact to this Bragg section, which itself can be tuned over wavelengths greater than 4 nm.

By injecting a current into the phase tuning section via the fine tuning contact the position of the resonator modes can be adjusted as can be seen in FIG. 3c, showing the respective Fabry-Perot spectrum FP. This fine tuning section having a length $L_P$ of 150 µm adjusts the output light to the desired wavelength and optimizes the optical phase to give good side mode suppression.

The resulting filtering function for a selected wavelength $\lambda_0$ is shown in FIG. 3d. Due to the double filtering effect, a longitudinal mode is selected with high side mode suppression ratio (SSR). By appropriate adjustment of the three tuning currents, applied to the three contacts, coarse tuning contact, fine tuning contact and medium tuning contact, all wavelengths within the material gain bandwidth of the semiconductor material can be selected.

As in the vertical Mach-Zehnder laser (VMZ) the active and the tuning region may be combined both in one wave-guide WG1 or WG2. The respective other wave-guide then serves as a passive wave-guide. This has the advantage that the net gains for both modes remain constant during tuning, because the loss variations in the tuning range are exactly compensated by gain changes in the nearby active region. Another design is, where WG1 (WG2) is the active layer and WG2 (WG1) is the tuning layer. FIGS. 4a and b show schematically the cross section of the device, where the active and the tuning layer correspond to WG1 and WG2, respectively.

FIGS. 4c and 4d show cross sectional views of the device, where the active and the tuning layers are combined in WG2. FIGS. 4a and c are cross sectional views of a region, where both, the first wave guide WG1 and the active and tuning layer is possible active and tuning layer is possible second wave guide WG2 are present, whereas FIGS. 4b and d are cross-sections in the passive region, where only one wave guide is present. The function and the doping using the InP material system are listed n the table below. The active and tuning layer are arranged in such way that separate current injections into the active and tuning layer is possible.

In the known Vertical Grating Assisted Co-directional Coupler Laser with Rear Sampled Grating Reflector (GCSR laser) only about 25% of the total resonator length is covered by the gain section. Due to the short gain section (i.e. the section below the gain contact) the optical output power is very pure. An important aspect of the laser according to the present invention is that in contrast to the known GCSR laser, the gain region is combined within the far selecting filter element and thus covering a significant part of the entire laser cavity. This allows much higher optical output power with superior optical properties compared with the GCSR laser.

Figure 5:
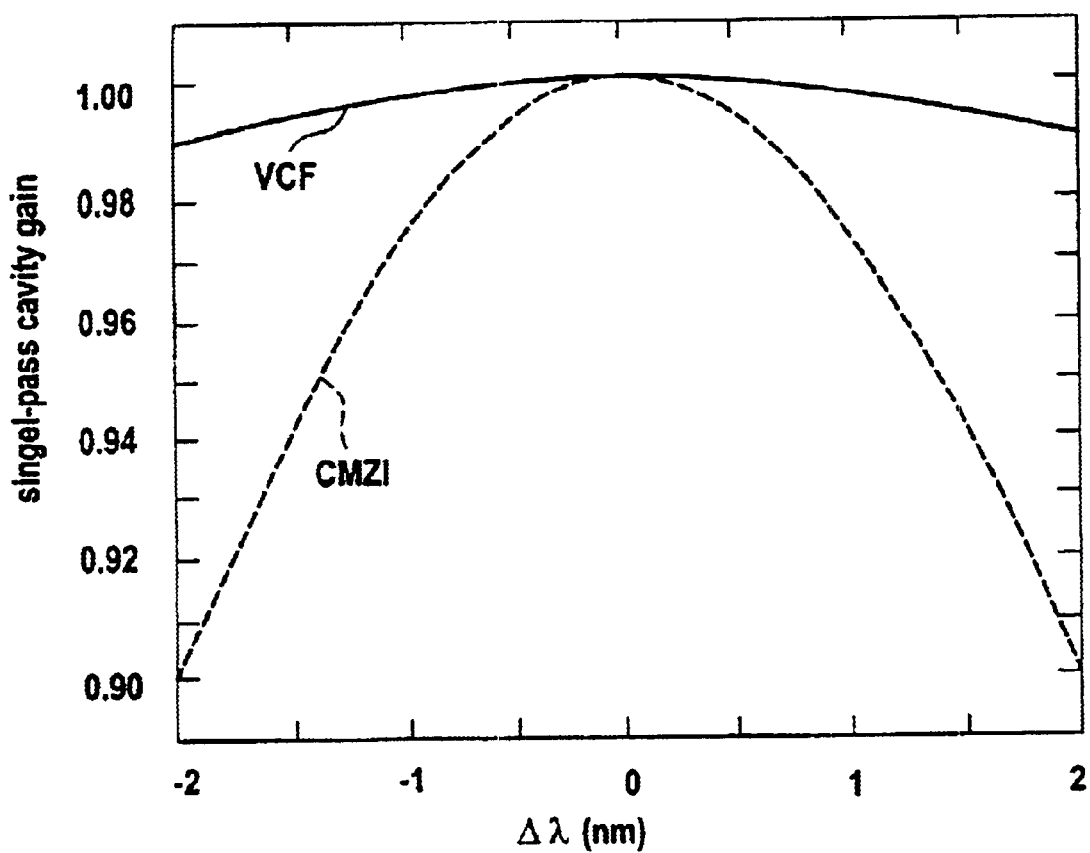
FIG. 5 an illustration showing a comparison of the filter characteristics of VCF and double Mach-Zehnder interferometer with equal length $L_f$=500 $\mu$m.

The combined Mach-Zehnder interferometer (CMZI) additionally reveals a much better filtering mechanism. A single path filter curve of both a vertical coupler filter (VCF) and a combined Mach-Zehnder interferometer (CMZI) with identical length are depicted in FIG. 5. For comparison, both filters are designed to allow a shift of the filter curve of 75 nm. It can be seen that the CMZI exhibits a much sharper filtering.

The longitudinal sectioning into four zones represents a further disadvantage of the GCSR laser. This makes manufacturing of these components more difficult and increases the total laser length. The presented device according to the invention has a much easier manufacturing technology compared with the GCSR laser where a coupler section including a grating and additional the active section has to be longitudinally integrated. The simplified manufacturing process can be seen by comparing the layout of the known GCSR laser of FIG. 1 with the layout of the presented novel device of FIG. 2.

The presented novel type of laser of the invention is optically and mechanically similar to a DFB or DBR laser, allowing it to be packaged in an industry-standard package, with isolator and cooler.

TABLE

| No. | layer | material |
|---|---|---|
| 1 | cladding layer | P-InP |
| 2 | waveguide | p-InGaAsP |
| 3 | separation layer | p-InP |
| 4 | tuning layer | InGaAsP |
| 5 | separation layer | n-InP |
| 6 | active layer | InGaAsP |
| 7 | substrate | p-InP |
| 8 | cladding layer | n-InP |
| 9 | cladding layer | n-InP |
| 10 | contact layer | p-InGaAsP |
| 11 | contact layer | n-InGaAsP |
| 12 | oxide (Al, Si) | — |
| Cn | n-contakt | Ti/Pt/Au |
| Cp | p-contakt | Ti/Pt/Au |

What is claimed is:

1. An integrated tunable laser structure comprising a substrate made of semiconductor material, the substrate comprising:

a first section for providing a low-selective interferometric filtering together with an amplification of a light wave resonating in the laser structure;

a second section for providing continuous fine-tuning and phase adjustment of the light wave; and a third section for providing a wavelength selective reflection of the light wave, wherein each section is adapted for current injection, wherein a current into the first section causes a wavelength shift of the low-selective interferometric filtering, a current into the second section causes a wavelength shift of resonator modes, and a current into the third section causes a wavelength shift of the wavelength selective reflection.

2. The integrated tunable laser of claim 1, wherein the first section comprises a coarse wavelength selective section provided with a gain contact and with a tuning contact for current injection.

3. The integrated tunable laser of claim 1, wherein semiconductive layers forming in vertical direction at least two layers, the one of which is a first wave guide layer and the other is a second wave guide layer.

4. The integrated tunable laser of claim 1, wherein the second section comprises a phase tuning section for fine tuning, having at least one wave guide layer continued from the first section, a short length LP, and on the upper or lower surface of the second section a tuning contact for current injection for fine tuning of the laser light output.

5. The integrated tunable laser of claim 1, wherein the third section comprises a comb mode reflection spectrum.

6. The integrated tunable laser of claim 5, wherein the comb mode reflection spectrum comprises a sampled grating and/or a super structure grating.

7. The integrated tunable laser of claim 5, wherein the third section comprises on the upper or lower surface of the third section a tuning contact for current injection for medium range tuning.

8. An integrated tunable laser structure comprising a substrate made of semiconductor material, the substrate having:

a first section for providing low-selective interferometric filtering and amplification of a light wave;

a second section for providing a phase tuning for continuous fine-tuning; and a third section forming a selectively reflective device, wherein the sections are designed for current injection, and wherein a current into the first section causes a wavelength shift of the low selective interferometric filtering, a current into the second section causes a wavelength shift of resonator modes, and a current into the third section causes a wavelength shift of the selective reflective device, in such a way that one reflection peak of a reflection spectrum corresponds to that of a filter response of the first section.

9. The integrated tunable laser of claim 2, wherein the gain contact is located on the upper surface of the first section and the tuning contact is located on the lower surface of the first section.

10. A method of providing an integrated tunable laser structure in a semiconductor material comprising:

providing a first semiconductor material section adapted for providing a low-selective interferometric filtering together with an amplification of a light wave resonating in the laser structure, providing a second semiconductor material section adapted for providing continuous fine-tuning and phase adjustment of the light wave, providing a third semiconductor material section adapted for providing a wavelength selective reflection of the light wave, wherein injection of a current into the first section causes a wavelength shift of the low-selective interferometric filtering, an injection of a current into the second section causes a wavelength shift of resonator modes, and an injection of a current into the third section causes a wavelength shift of the wavelength selective reflection.

11. The method of providing an integrated tunable laser structure in a semiconductor material of claim 10, wherein the first section comprises a coarse wavelength selective section provided with a gain contact and with a tuning contact for current injection.

12. The method of providing an integrated tunable laser structure in a semiconductor material 10, wherein semiconductive layers forming in vertical direction at least two layers, the one of which is a first wave guide layer and the other is a second wave guide layer.

13. The method of providing an integrated tunable laser structure in a semiconductor material of claim 10, wherein the second section comprises a phase tuning section for fine tuning, having at least one wave guide layer continued from the first section, a short length LP, and on the upper or lower surface of the second section a tuning contact for current injection for fine tuning of the laser light output.

14. The method of providing an integrated tunable laser structure in a semiconductor material of claim 10, wherein the third section comprises a comb mode reflection spectrum.

15. The method of providing an integrated tunable laser structure in a semiconductor material of claim 14, wherein the comb mode reflection spectrum comprises a sampled grating and/or a super structure grating.

16. The method of providing an integrated tunable laser structure in a semiconductor material of claim 14, wherein the third section comprises on the upper or lower surface of the third section a tuning contact for current injection for medium range tuning.

17. The method of providing an integrated tunable structure in a semiconductor material of claim 10, wherein the gain contact is located on the upper surface of the first section and the tuning contact is located on the lower surface of the first section.

* * * * *